(12) United States Patent  (10) Patent No.: US 12,375,008 B2
Brazeau et al.  (45) Date of Patent: Jul. 29, 2025

(54) INVERTER WITH CAPACITOR DISCHARGE AND DC BUS FILTERING

(71) Applicant: DANA TM4 INC., Boucherville (CA)

(72) Inventors: Michel Brazeau, Delson (CA); Pascal Fleury, Sainte-Madeleine (CA); Francois Dube, Montreal (CA); Maxime Caron, Montreal (CA); Maalainine El Yacoubi, Sainte Julie (CA); Alexandre Marquis, Boucherville (CA)

(73) Assignee: DANA TM4 INC., Boucherville (CA)

( * ) Notice: Subject to any disclaimer, the term of this patent is extended or adjusted under 35 U.S.C. 154(b) by 252 days.

(21) Appl. No.: 18/054,094

(22) Filed: Nov. 9, 2022

(65) Prior Publication Data
US 2024/0154539 A1 May 9, 2024

(51) Int. Cl.
*H02M 1/44* (2007.01)
*B60L 53/20* (2019.01)
*H02M 1/12* (2006.01)
*H02M 7/00* (2006.01)
*H02M 7/5387* (2007.01)
*H05K 7/14* (2006.01)

(52) U.S. Cl.
CPC ............ *H02M 7/003* (2013.01); *B60L 53/20* (2019.02); *H02M 1/126* (2013.01); *H02M 1/44* (2013.01); *H02M 7/53875* (2013.01); *H05K 7/1432* (2013.01); *B60L 2210/40* (2013.01)

(58) Field of Classification Search
CPC ........ H02M 7/003; H02M 1/126; H02M 1/44; H02M 7/53875; B60L 53/20; B60L 2210/40; H05K 7/1432
See application file for complete search history.

(56) References Cited

U.S. PATENT DOCUMENTS

| | | | |
|---|---|---|---|
| 8,169,789 B1* | 5/2012 | Tong | H05K 7/20509 361/760 |
| 8,665,623 B2 | 3/2014 | Suzuki et al. | |
| 9,300,221 B2 | 3/2016 | Asako | |
| 9,847,730 B2* | 12/2017 | Namba | H01F 17/062 |
| 10,128,770 B2* | 11/2018 | Goto | H02M 7/003 |
| 2010/0315190 A1* | 12/2010 | Haj-Maharsi | H01F 27/40 336/192 |
| 2017/0063203 A1 | 3/2017 | Doo | |
| 2018/0358903 A1* | 12/2018 | Takahashi | H02M 7/003 |
| 2021/0013782 A1* | 1/2021 | Kobayashi | F04B 39/121 |
| 2021/0099072 A1 | 4/2021 | Uryu | |
| 2021/0274690 A1 | 9/2021 | Cho et al. | |
| 2023/0071172 A1* | 3/2023 | Fujiwara | H03H 7/0115 |
| 2024/0007013 A1* | 1/2024 | Lipp | H02M 7/003 |

FOREIGN PATENT DOCUMENTS

| | | |
|---|---|---|
| WO | 2010127654 A2 | 11/2010 |
| WO | 2018028988 A1 | 2/2018 |

* cited by examiner

*Primary Examiner* — Gary L Laxton
(74) *Attorney, Agent, or Firm* — McCoy Russell LLP

(57) ABSTRACT

An inverter assembly including a phase-control chamber and a direct current (DC) chamber. The phase-control chamber includes a direct current (DC) link capacitor electrically connected a control circuit board via multiple connectors. The DC chamber includes a ferrite filter fixed to a DC bus bar via a support component.

19 Claims, 7 Drawing Sheets

INVERTER WITH CAPACITOR DISCHARGE AND DC BUS FILTERING

TECHNICAL FIELD

The present disclosure relates to an inverter designed with connectors between a direct current (DC) link capacitor and a control circuit board as well as a DC bus ferrite filter.

BACKGROUND AND SUMMARY

Inverters are used in a variety of fields to change direct current (DC) to alternate current (AC). Inverters are used in a variety of fields such as electric vehicles, solar installations, industrial equipment, etc. Inverters use power modules that switch at high frequency to enable the DC to AC conversion functionality.

Previous inverters have exhibited issues with regard to premature degradation as well as undesirable complexity. Consequently, certain prior inverters may be costly from a manufacturing perspective and may not achieve lifespan targets in some cases.

US 2018/0358903 A1 to Takahashi et al. discloses a power converter for an all-electric or hybrid electric vehicle. The power converter includes a smoothing capacitor and a discharge resistor that is electrically connected to the capacitor via the positive and negative bus bars in an attempt to decrease the amount of heat transferred to the capacitor.

The inventors have recognized several drawbacks with Takahashi's power converter and other previous power converters. For instance, Takahashi's power converter, as well as other power converters, may experience over-temperature conditions in the bus bars as well as undesirable vibrations, particularly in the bus bars.

The inventors have recognized the aforementioned challenges and developed an inverter assembly to at least partially overcome the challenges. The inverter assembly includes, in one example, a phase-control chamber with a DC link capacitor that is electrically connected a control circuit board (e.g., a control printed circuit board assembly (PCBA)) via multiple connectors (e.g., connection bus bars). The inverter assembly further includes a DC chamber with a ferrite filter fixed to a DC bus bar via a support component. Using the connectors to connect the DC link capacitor to the control circuit board. Further, in such an example, a compliant pad is positioned between the ferrite filter and the support component. Using the multiple connectors allows the space efficiency of the inverter to be increased by reducing the number of circuit boards, if desired. The compliant pad reduces the amount vibration transferred to the DC bus bar assembly, thereby increasing the inverter's longevity. Further, the ferrite filter allows the amount of electromagnetic interference (EMI) in the DC chamber to be reduced. Consequently, the chance of undesirable inverter operation caused by EMI is reduced. Further, the inverter's size can be reduced due to decreased EMI, if desired, when compared to inverters which position all of the internal circuitry in a single housing enclosure.

In one example, the phase-control chamber may include a discharge resistor coupled to the control circuit board and in thermal contact with a housing. Continuing with this example, the discharge resistor may be configured to discharge the DC link capacitor when the inverter assembly is turned off. In this way, the capacitor is discharged when the inverter is turned off and the resistor which provides the discharge functionality is cooled, to avoid the chance of the resistor experiencing an over-temperature condition. Consequently, thermal management in the inverter is enhanced.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

An inverter is described herein that strategically reduces noise, vibration, and harshness (NVH) in a direct current (DC) bus bar assembly, and achieves enhanced thermal management for internal componentry. The inverter described herein may further achieve increased space efficiency and reduced complexity, if desired. To attain at least some of these characteristics, the inverter includes a DC link capacitor electrically connected a control circuit board via multiple connectors (e.g., connection bus bars or springs) and a ferrite filter that is fixed to a DC bus bar via a support component as well as a compliant pad which is positioned between the ferrite filter and the support component. The inverter may further include a discharge resistor configured to discharge the capacitor when the inverter is turned off and coupled to the control circuit board. To cool the discharge resistor, the resistor may be in thermal contact with the inverter's housing via a thermal pad.

Figure 1:
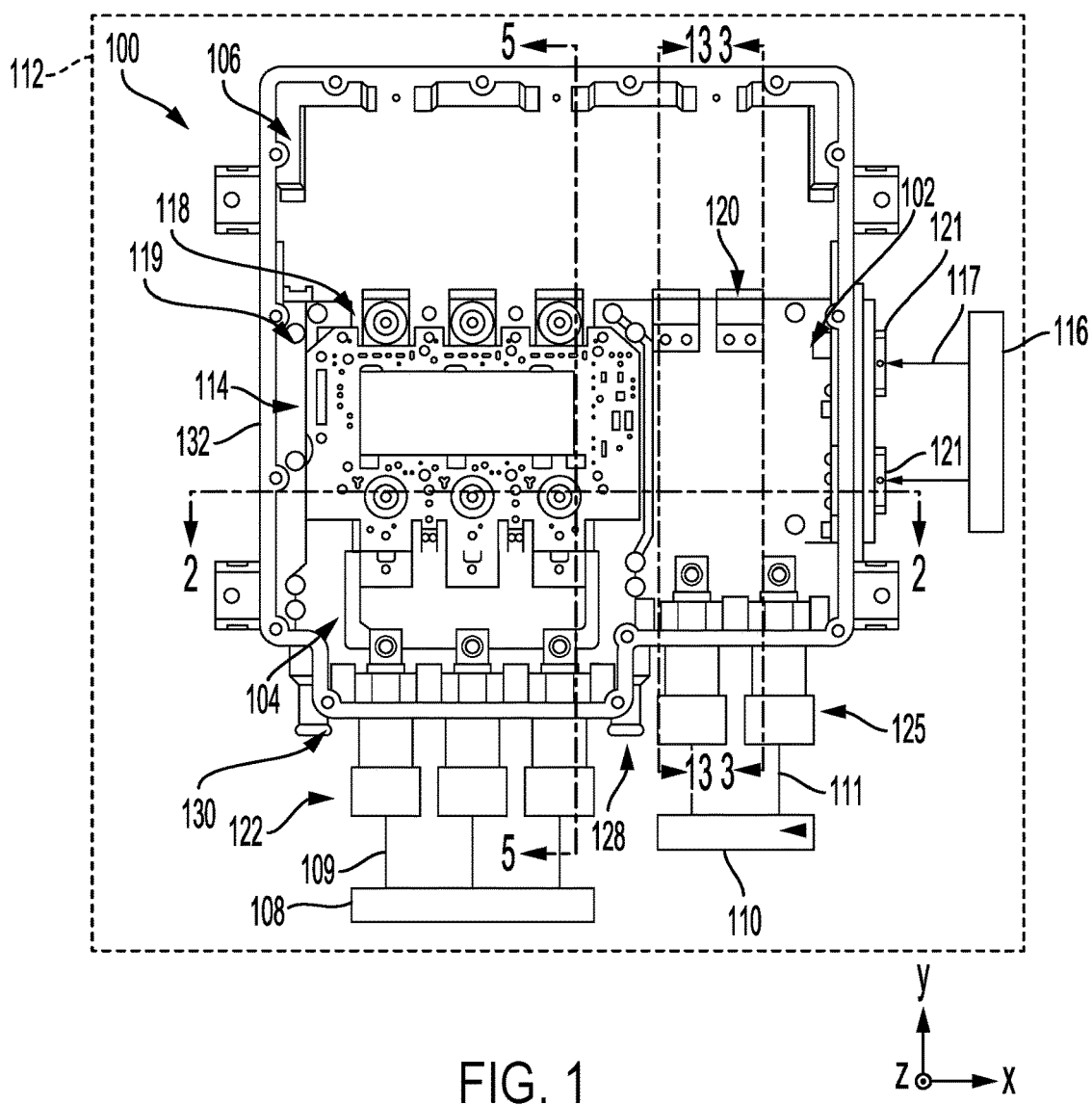
FIG. 1 is an illustration of an inverter and an exemplary operating environment in which it may be utilized.

FIG. 1 depicts an inverter 100 that is designed to convert DC to alternating current (AC). To achieve this functionality, the inverter 100 includes a DC bus bar assembly 102 and an AC bus bar assembly 104 which are both electrically connected to a DC link capacitor 106 either directly or indirectly. To form the internal electrical connections in the inverter described herein conductive plates, harnesses, capacitors, cables, combinations thereof, and the like may be used to establish these connections. Similarly, cables, harnesses, combinations thereof, and/or other suitable components for establishing electrical connections may be used to electrically couple the inverter to external components. However, cables, under some operating conditions, function as antennas which pick up electromagnetic interference (EMI) noise. Therefore, use of extraneous cables within the inverter may be reduced (e.g., avoided) to diminish internal EMI.

The inverter 100 may be coupled to an alternating current (AC) electrical component 108 and a DC electrical component 110 (e.g., a vehicle energy storage system, in an electric vehicle (EV) embodiment). Cables 109 and 111 and/or other suitable electrically conductive components may be used to electrically couple the AC electrical component 108 and the DC electrical component 110 to the inverter 100. In one example, the inverter 100 may be included in an EV 112 or other suitable electric system, and may be referred to as a power electronics unit, in the EV example. In such an example, the inverter adjusts the speed of a traction motor in the vehicle. The EV 112 may be a light, medium, or heavy duty vehicle. In such an example, the AC electrical component 108 may be a traction motor and the DC electrical component 110 may be a traction battery. However, it will be understood that the inverter may be included in a variety of environments. For example, the inverter 100 may be included in a solar power installation, an industrial machine, and the like.

Further, the inverter 100 may include a gate-driver circuit board (e.g., a gate-driver printed circuit board assembly (PCBA)) 114 that is designed to control the power distributed by the inverter 100. For instance, in the EV example, the gate-driver circuit board 114 adjusts the amount of power supplied to the traction motor to alter the motor's speed. However, as indicated above the inverter may be used in a variety of operating environments. The gate-driver circuit board 114 and the other circuit boards described herein may include one more microprocessors, memory, and the like to achieve the power adjustment functionality. A control circuit board 310 (e.g., the control PCBA), shown in FIG. 3, may receive electrical energy and receive signals from and send signals to a lower voltage component 116 as indicated via arrows 117. To elaborate, electrical connectors 121 that form an external communication interface serve as the connection between the lower voltage component 116 and a flexible circuit board 900, shown in FIGS. 9 and 10, which is electrically connected to the control circuit board 310, shown in FIG. 3 and discussed in greater detail herein. The lower voltage component may include a lower voltage power supply and/or a controller. As such, this electrical energy may have a lower voltage than the electrical energy flowing into and out of the inverter via the connectors 122 and 125.

As illustrated in FIG. 1, the DC link capacitor 106 is electrically coupled to a power module 119 (e.g., a power transistor module) via an electrical interface 118 (e.g., DC bus bar interface). The electrical interface 120 between the DC bus bar assembly 102 and the DC link capacitor 106 is further depicted. Further, electrical connectors 122 that facilitates efficient electrical coupling between phase bus bars in the AC bus bar assembly 104 and the AC electrical component 108 is additionally illustrated in FIG. 1. DC input connectors 125 that facilitate efficient electrical coupling between DC bus bars in the DC bus bar assembly 102 and the DC electrical component 110 (e.g., the vehicle's energy storage system, as indicated above) are further illustrated in FIG. 1. However, other arrangements of the power module and the DC link capacitor have been contemplated.

In the illustrated example, a coolant inlet 128 and a coolant outlet 130 are further included in the inverter 100. A housing 132 may include coolant conduits through which the coolant circulates and removes heat from the inverter 100. Suitable cooling system components may be hydraulically coupled to the coolant inlet and outlet such as one or more pumps, a heat exchanger, a filter, and the like. The coolant may include water, glycol, combinations thereof, and the like. However, the cooling system may have a different configuration or be omitted, in other examples.

An axis system is provided in FIG. 1 as well as FIGS. 2-13, for reference. The z-axis may be a vertical axis (e.g., parallel to a gravitational axis), the x-axis may be a lateral axis (e.g., horizontal axis), and/or the y-axis may be a longitudinal axis, in one example. However, the axes may have other orientations, in other examples. Cutting planes 2-2, 3-3, 5-5, and 13-13 indicating the locations of the cross-sectional views depicted in FIGS. 2, 3, 5, and 13 are provided for reference in FIG. 1.

Figure 2:
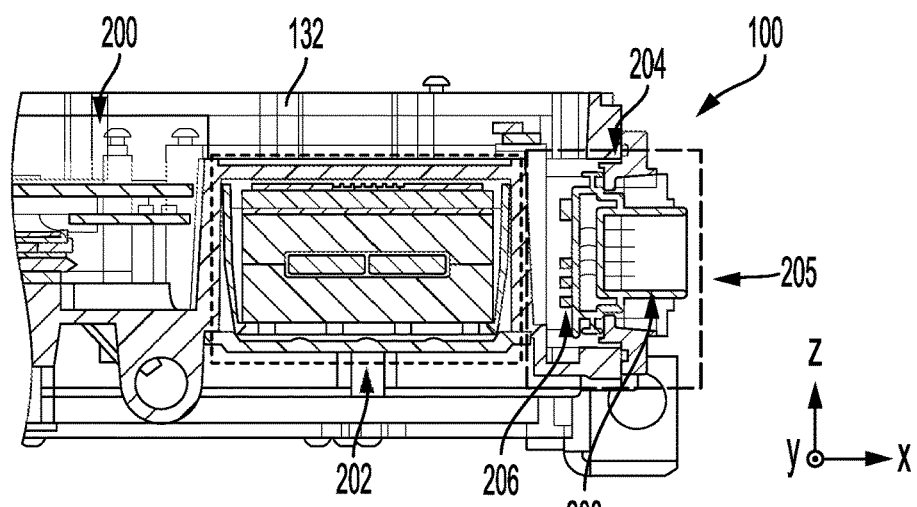
FIG. 2 is a cross-sectional view of the inverter, depicted in FIG. 1, with the cross-section extending through multiple chambers in the housing.

FIG. 2 shows a cross-sectional view of the inverter 100. The inverter 100 in the illustrated example, include multiple chambers within the housing 132. These chambers include a phase-control chamber 200, a DC chamber 202 (e.g., DC separated chamber), and/or an external communication chamber 204. Partitioning the housing into these chambers enables EMI to be reduced, enabling the inverter to be more compliant to electromagnetic emissions targets. The phase-control chamber 200 contains (e.g., fully encloses) the gate-driver circuit board 114, the AC bus bar assembly 104 depicted in FIG. 1, and partially encloses a control circuit board 310, shown in FIG. 3.

Further, the DC chamber 202 contains the DC bus bar assembly 102 depicted in FIG. 1, and the external communication chamber 204 may contain LV communication components (e.g., a communication circuit board 206, connectors 208, and the like) designed to interface with components external to the inverter. The phase-control chamber 200 may have greater noise than the DC chamber. Additionally, the external communication chamber may have less noise than the DC chamber. In this way, the external communication chamber is designed to protect the LV signals from the noise present in the phase-control chamber.

The DC chamber 202 may be positioned laterally between the phase-control chamber 200 and the external communication chamber 204 (e.g., lower voltage (LV) chamber) and the external communication chamber 204 is positioned on a lateral side 205 of the inverter 100. Partitioning the housing into these chambers enables EMI to be reduced thereby increasing inverter 100 performance. The phase-control chamber 200 contains (e.g., at least partially encloses) the gate-driver circuit board 114 and the AC bus bar assembly 104 depicted in FIG. 1, the DC chamber 202 contains the DC bus bar assembly 102 depicted in FIG. 1, and the external communication chamber 204 may contain external communication components (e.g., a communication circuit board 206, connectors 208, and the like) designed to interface with components external to the inverter. The phase-control chamber 200 may have a greater amount of EMI than the DC chamber 202. Additionally, the external communication chamber 204 may have less EMI than the DC chamber 202. The different chambers may be demarcated via walls of the housing 132.

Figure 3:
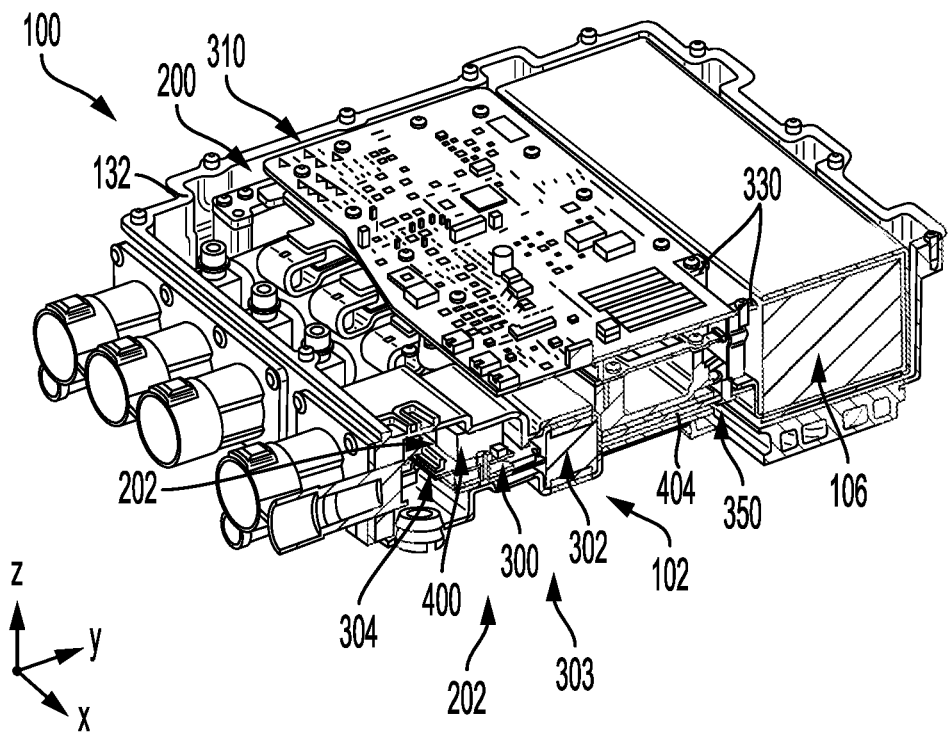
FIG. 3 is a cross-sectional view of the inverter, depicted in FIG. 1, with the cross-section extending through a direct current (DC) assembly.

FIG. 3 shows a cross-sectional view of the inverter 100 with internal features of the DC bus bar assembly 102 revealed. The AC bus bar assembly 104 and the capacitor 106 are again depicted. The control circuit board 310 is further illustrated in FIG. 3. The control circuit board 310 is designed to alter an amount of electric power distributed from the power electronics unit to the external AC electrical component 108 (e.g., the traction motor).

The DC bus bar assembly 102 includes an entry cavity 300 and a ferrite filter 302. The ferrite filter 302 may be formed in multiple sections, in some examples. The construction of the ferrite filter is expanded upon herein with regard to FIG. 4.

The entry cavity 300 may contain an EMI PCB assembly 303. In the illustrated example, the EMI PCB assembly 303 includes EMI filtering capacitors 400, a current sensor 402 shown in FIG. 3, and an electrical connector 304 that is designed to electrically connect to the gate-driver circuit board 114, shown in FIG. 1. The DC bus bar assembly 102 is positioned in the DC chamber 202 of the housing 132, as previously discussed. However, in alternate examples, the DC chamber and the external communication chamber may form a single chamber.

As previously indicated, the DC chamber 202 is separated (e.g., isolated) from the other chambers and provide a cleaner zone (with regard to EMI) which contains EMI noise sensitive components such as the DC bus bar assembly 102, the EMI filtering capacitors 400 (described in greater detail herein), and an electrical interface 350 with the capacitor 106.

FIG. 3 further shows one of the DC bus bars 404 and connectors 330 that electrically couple the control circuit board 310 to the DC link capacitor 106. The connectors 330 and the DC bus bars 404 are further described herein. Further, the control circuit board 310 is shown positioned in the phase-control chamber 200.

Figure 4:
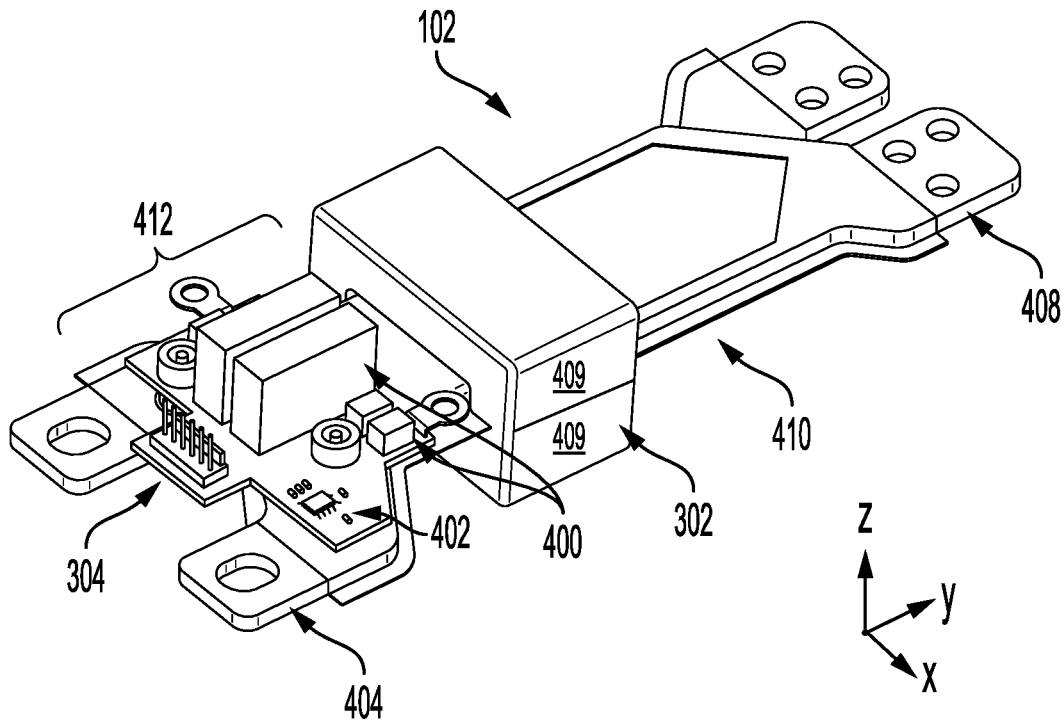
FIG. 4 is a detailed perspective view of the DC bus bar assembly in the inverter, depicted in FIG. 1.

FIG. 4 shows a detailed view of the DC bus bar assembly 102 with DC bus bars 404 which include holes or other suitable features that enable the DC bus bars to function as an electrical input interface (e.g., bolted electrical input interface) to the DC input connectors 125, shown in FIG. 1. The DC bus bar assembly 102 further includes output bus bars 408 (e.g., bolted electrical output interface) that is coupled to the capacitor 106, shown in FIG. 1, when assembled. The output bus bars 408 includes tabs with openings to enable a robust electrical connection to be established. The DC bus bars 404 and the other bus bars described herein may be constructed out of a suitable conductive material such as copper, aluminum, brass, combinations thereof, and the like.

In the illustrated example, the ferrite filter 302 is included in the DC bus bar assembly 102. The ferrite filter 302 is designed to reduce EMI noise exiting the inverter, towards the DC electrical component 110, shown in FIG. 1. Consequently, the inverter may be placed closer to the DC electrical component, if desired. Specifically, in the illustrated example, the ferrite filter 302 extends around the body 410 of the assembly at a mid-portion thereof. However, in other examples, the ferrite filter may have a different contour (e.g., positioned on an upper or lower side of the body of the bus bar assembly) and/or may be placed in a different location along the bus bar assembly. In the illustrated example, the body 410, the bus bars 404, and the bus bars 408 form a continuous shape. However, other bus bar assembly configurations may be used, in other examples.

The ferrite filter 302 may be constructed with different ferrite filter sections 409. These sections may specifically include an upper section and a lower section that when brought together surround the body 410 of the DC bus bar assembly 102. Designing the ferrite filter in multiple sections allows the DC bus bar assembly to be more efficiently constructed. The ferrite filter sections 409 may have a C-type shape to enable the filter to contour to the bus bar body 410, thereby increasing the DC bus bar assembly's space efficiency.

The ferrite filter 302 may specifically be a common-mode filter which selectively removes noise in a targeted frequency range while allowing signals in another frequency to pass, in one example. In this way, the DC bus bar assembly may precisely filter out undesirable noise.

The DC bus bar assembly 102 further includes an EMI filtering and current sensing circuit board 412. In the illustrated example, the EMI filtering and current sensing circuit board 412 includes the EMI filtering capacitors 400, the current sensor 402 (e.g., hall effect sensor), and the connector 304 (e.g., the signal harness). The current sensor 402 reads the DC current flowing through the DC bus bars 404. The connector 304 sends signals to the control circuit board 310, shown in FIG. 3. Wires may be used to send the signals between the connector 304 and the control circuit board 310. The EMI filtering capacitors 400 decrease the amount of EMI noise coming out of the inverter towards the external DC electrical component 110 (towards the vehicle high-voltage power distribution system).

The EMI filtering and current sensing circuit board 412 with the sensing and filtering components may be positioned between the DC bus bars 404 and the ferrite filter 302, in relation to the y-axis. In this way, the circuitry on the board may be protected from EMI, thereby increasing inverter performance in comparison to inverters without the EMI filtering features described herein.

Further, positioning the EMI filtering and current sensing circuit board 412 near the DC input connectors 125, shown in FIG. 1, allows the current sensor to have closer proximity to the DC bus bars 404 than other locations such as near the rear of the DC bus bar assembly 102. In this way, the current sensor reading may be simplified which enables the signal to be processed using less processing resources, if wanted.

It will also be appreciated that a field concentrator may be omitted from the inverter due to the placement of the EMI filtering and current sensing circuit board 412 near the input connectors 125, shown in FIG. 1, (e.g., near the front of the DC bus bar assembly 102), if wanted. When the field concentrator is omitted, the DC current sensor signal may be filtered and compensated to remove the AC components from the signal. The DC current signal processing may contain one or more of the following processing strategies: offset calibration; gain calibration; low-pass filtering; and external field cancellation (e.g., the removal of influence from nearby conductors such as the phase bus bars).

Figure 5:
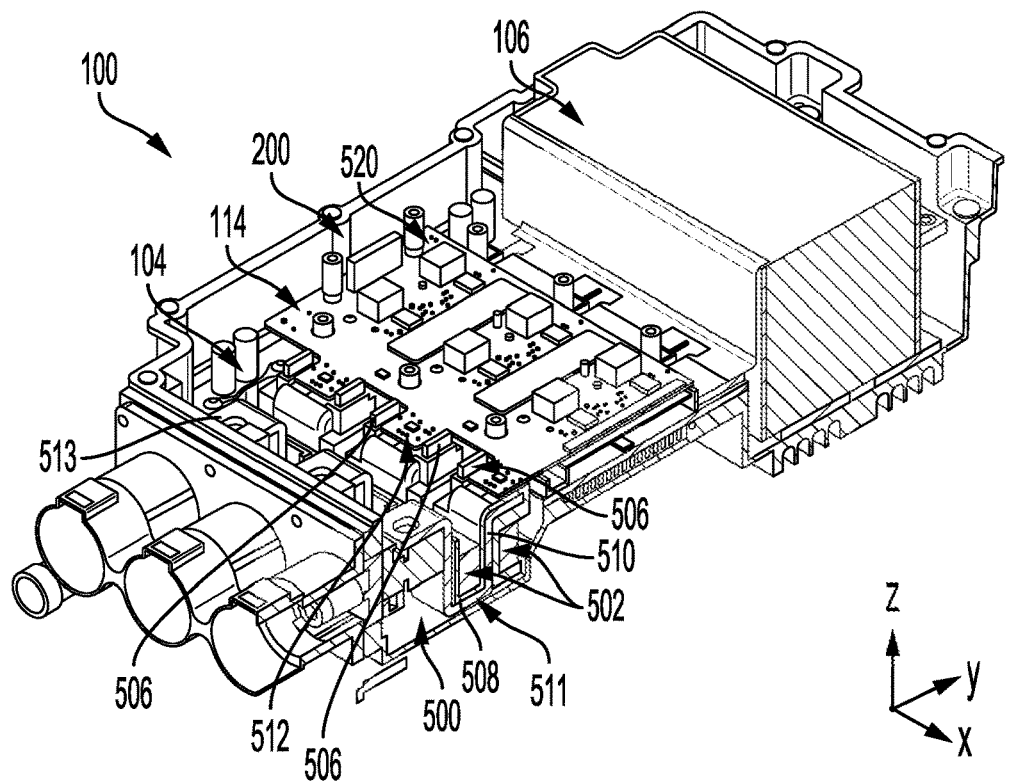
FIG. 5 is a cross-sectional view of the inverter, depicted in FIG. 1, with the cross-section extending through an alternating current (AC) bus bar assembly.

FIG. 5 shows a cross-sectional view of the AC bus bar assembly 104 and the capacitor 106 in the inverter 100 along with the gate-driver circuit board 114. In the illustrated example, the AC bus bar assembly 104 includes phase bus bars 500, a ferrite filter 502, and current sensor shields 506 which may be incorporated into a plastic molding 508. The plastic molding 508 functions to retain these components in a single structure for simplified installation. The plastic molding 508 further enables a section 510 of the phase bus bars 500 to be arranged between ferrite filter 502 to reduce the amount of undesirable EMI noise which exits the inverter toward the external AC electrical component 108, shown in FIG. 1. The phase bus bars 500 further includes a section 511 that extends under (with regard to the z-axis) the plastic molding 508. Section 511 provide a thermal interface to the cooling surface under the phase bus bars 500. Further, the phase bus bars 500 are connected to AC outlet connectors 513.

The current sensor shields 506 are positioned around the AC current sensors 512 on the gate-driver circuit board 114. In this way, phase-to-phase interference, also referred to as cross-talk, in the inverter is reduced.

In the phase-control chamber 200, components that are near the switched power circuits are separated (e.g., isolated) from the other chambers. These components may include the gate-driver circuit board 114 with semiconductors and semiconductor drivers 520, the DC link capacitor 106, and the AC current sensors 512.

Figure 6:
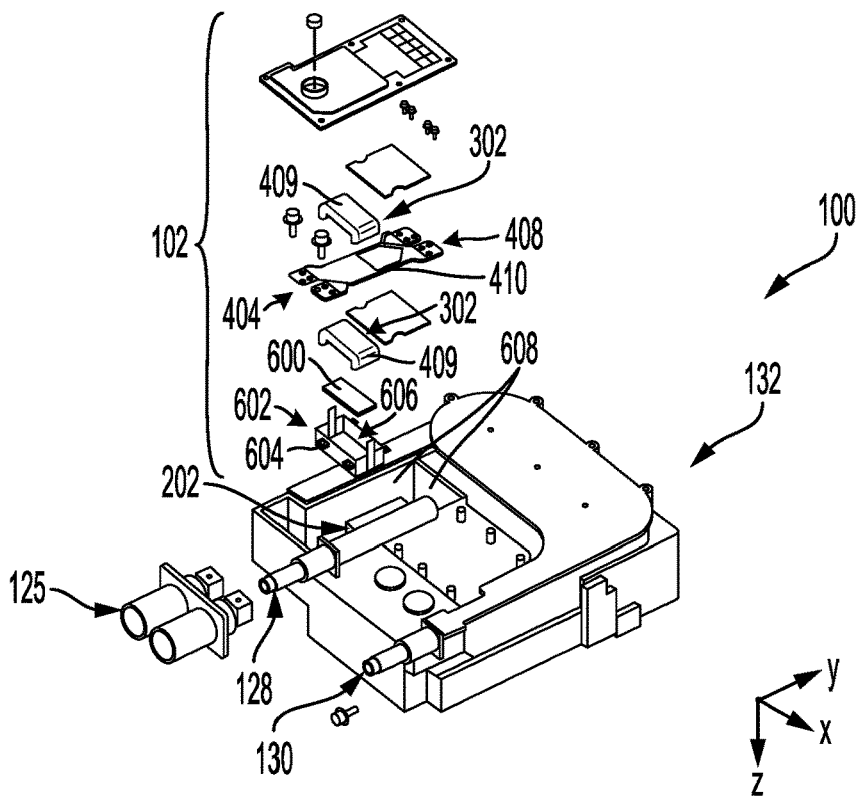
FIG. 6 is an exploded view of the DC bus bar assembly in the inverter, depicted in FIG. 1.

FIG. 6 shows the inverter 100 with the housing 132 and the DC bus bar assembly 102 in an exploded view. The DC bus bar assembly 102 includes the DC bus bars 404 formed on a conductive plate and the ferrite filter 302 which may at least partially surround the conductive plate and reduce the amount of EMI noise that exits the DC chamber. In this way, the likelihood of the inverter undesirably electromagnetically interfering with surrounding components is decreased. The DC input connectors 125 and the coolant inlet 128 and the coolant outlet 130 are again shown in FIG. 6.

The ferrite filter 302 may be constructed in multiple sections 409 (e.g., an upper and lower section), as shown in the illustrated example. When assembled the sections 409 surround the body 410 of the DC bus bars 404 and 408.

To reduce vibration transmission to the bus bar assembly 102, a compliant pad 600 and a support structure 602 (e.g., a polymer support) may be used to attach the bus bar assembly to the housing 132. The compliant pad 600 may be constructed out of a polymer foam to enable vibration attenuation. To elaborate, the compliant pad 600 reduces movement of the ferrite filter 302 to reduce ferrite filter vibration on the bus bar body 410. Constraining the movement of the ferrite filter 302 reduces the chance of the ferrite filter degrading (e.g., piercing) the electrical insulation materials that may be applied on and around the bus bar.

Further, the support structure 602 may be constructed out of a polymer to avoid an undesirable electrical connection between the housing 132 and the DC bus bar assembly 102. The support structure 602 holds the ferrite filter 302 around the bus bar body 410. Further, the support structure 602 may compress the ferrite filter 302 to further reduce the likelihood of ferrite filter vibration. To elaborate, to achieve a targeted amount of filter compression of the support structure 602, the threading engagement between the attachment devices and the housing may be adjusted. However, other techniques for augmenting filter compression have been contemplated.

Further, the support structure 602 may include attachment interfaces 604 that are designed to receive attachment devices (e.g., screws, bolts, combinations thereof, and the like) for attachment to the housing 132.

In the illustrated example, the support structure 602 includes a recess 606 that is sized to receive the compliant pad 600 and at least a portion of the ferrite filter 302. The recess 606 may have a rectangular shape in cross-section to enable the pad and the filter to be efficiently mated therewith, in one example. However, other contours of the support structure recess may be used in alternate examples. Using a support structure and compliant pad with the abovementioned features increases the space efficiency of the inverter while providing a desired filtering functionality.

FIG. 6 further shows walls 608 of the housing 132 that may demarcate the DC chamber 202. The walls 608 may each extend in a vertical direction. Further, one of the walls may extend in a longitudinal direction and another wall may extend in a lateral direction. In this way, the DC chamber may be contoured to enclose the DC bus bar assembly is a space efficient manner. However, other DC chamber contours have been contemplated.

Figure 7:
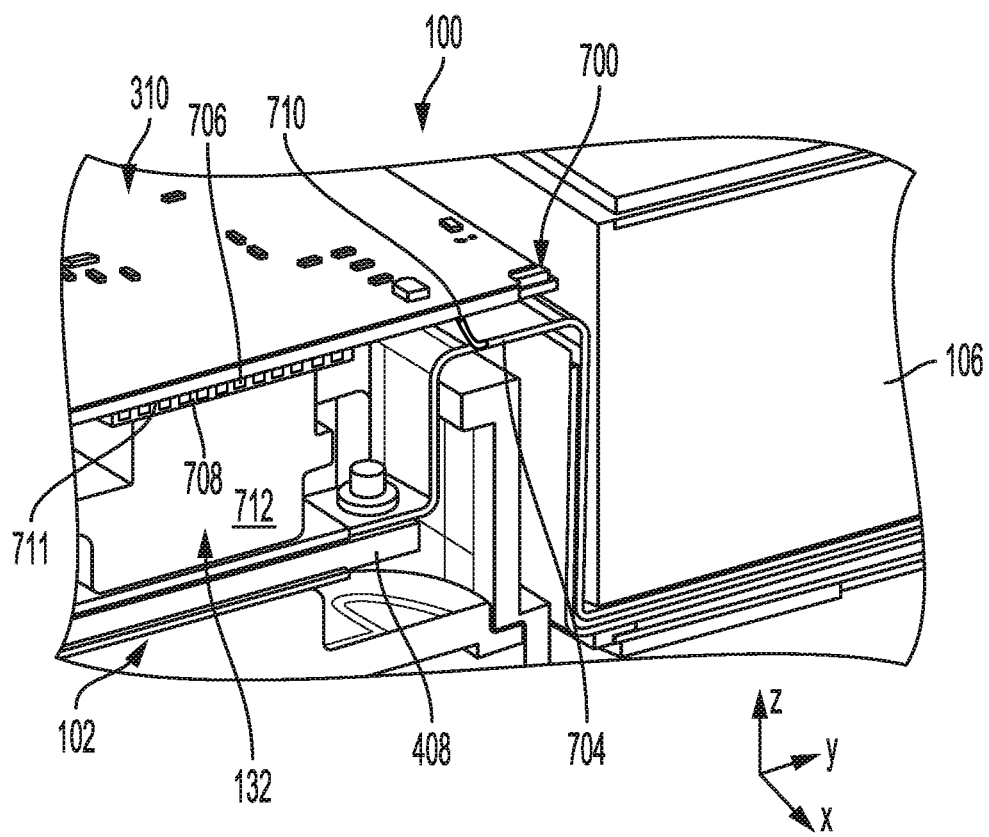
FIG. 7 is a detailed perspective view of the inverter, depicted in FIG. 1, with a current sensor positioned on a printed circuit board near a capacitor.

FIG. 7 shows a section of the inverter 100. The inverter 100 depicted in FIG. 7 has a current sensor 700 positioned on the control circuit board 310 as opposed to the EMI filtering and current sensing circuit board. The current sensor 700 generates a current reading of the current flowing through a bus bar 704 which electrically couples the DC bus bars 408 to the capacitor 106. Field concentrators may also be forgone in the inverter 100, to simplify inverter construction and increase the inverter's space efficiency.

Positioning the current sensor 700 on the control circuit board 310 allows the signal path to the microprocessor (which may also be placed on the control circuit board) to be reduced, if desired. Further, positioning the current sensor 700 on the control circuit board 310 also allows the use of a connector and harness system in the signal path to be avoided, if so desired.

FIG. 7 further shows discharge resistors 706 coupled to the control circuit board 310. In the illustrated example, the discharge resistors 706 is coupled to the control circuit board 310 and a thermal pad 708. To elaborate, Further, the discharge resistor 706 may be in thermal contact with the housing 132 by way of the thermal pad 708. The discharge resistors 706 may be positioned in recesses in the thermal pad 708 to increase the amount of heat transferred from the resistors to the housing. Sections of the thermal pad 708 between the recesses may be in contact with a lower surface 711 of the of the control circuit board 310. The discharge resistor 706 discharges the DC link capacitor 106 when the inverter assembly is turned off. The discharge functionality of the resistor 706 may be passively implemented without any control inputs.

FIG. 7 further shows an electrical spring connectors 710 that provide electrical connection between the control circuit board 310 and the bus bar 704. The electrical spring connectors 710 may be used in addition to or as an alternative as the connectors 330, shown in FIG. 3.

The thermal pad 708 may be coupled to the lower surface 711 of the control circuit board 310 and a section 712 of the housing that is coupled to the DC bus bar assembly 102. Designing the inverter with the resistors 706 and the thermal pad 708 allows the space efficiency of the inverter to be increased and further enables the number of circuit boards in the inverter to be reduced, if desired.

Figure 8:
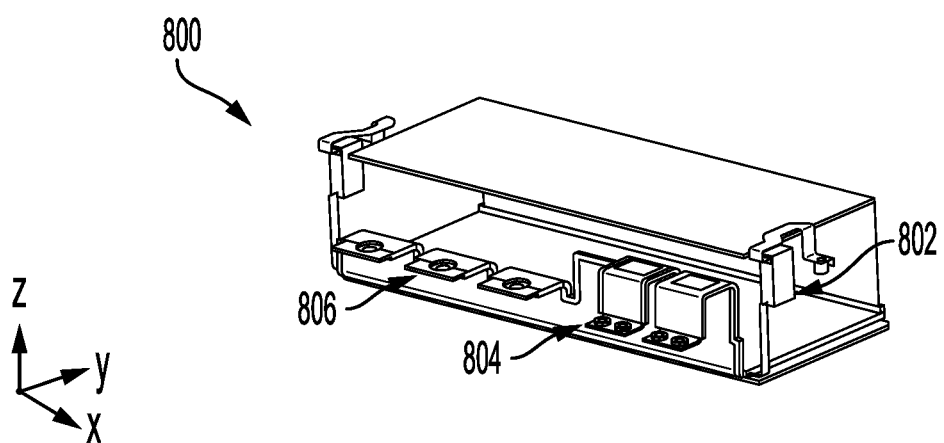
FIG. 8 is a perspective view of a y-capacitor in a decoupling link of an inverter.

FIG. 8 shows an example of a decoupling link 800 with y-capacitors 802 that function to filter EMI. The decoupling link 800 may be designed to selectively decouple the DC bus bar assembly 102, shown in FIG. 4 from the DC link capacitor 106. The decoupling link 800 includes electrical interfaces 804 that may be coupled to the DC bus bar assembly. The link 800 further includes electrical interfaces 806 that may be coupled to components in the phase-control chamber such as the gate driver circuit board, in one example. The y-capacitor 802 may be used as an alternative to the EMI filtering capacitors 400, shown in FIG. 4, in one example.

Figure 9:
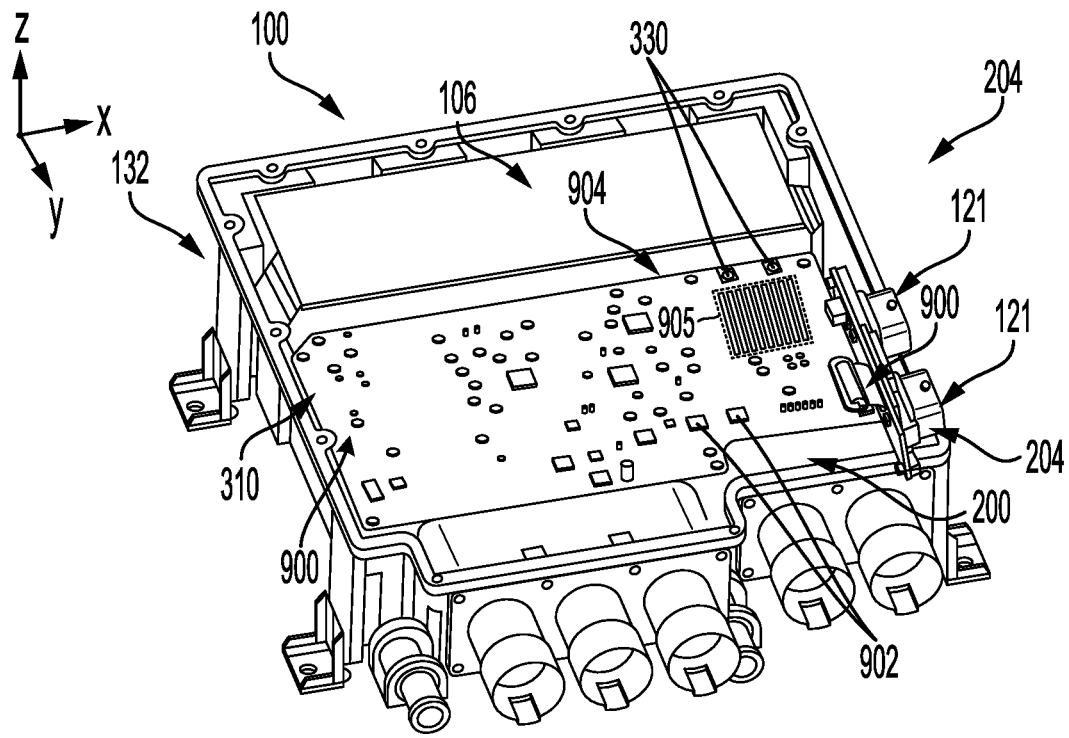
FIGS. 9-10 are different views of the control circuit board in the inverter, depicted in FIG. 1.
Figure 10:
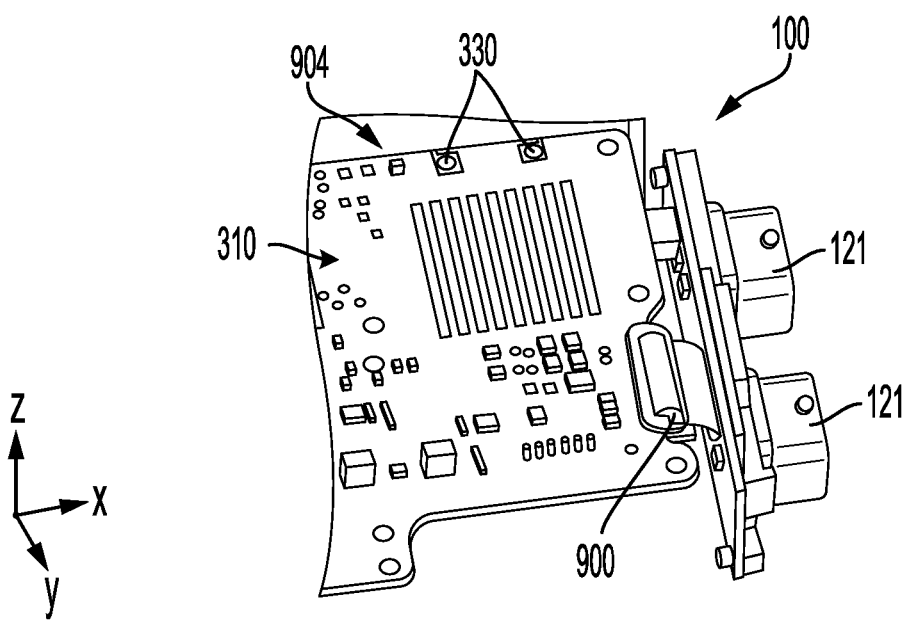
Figure 11:
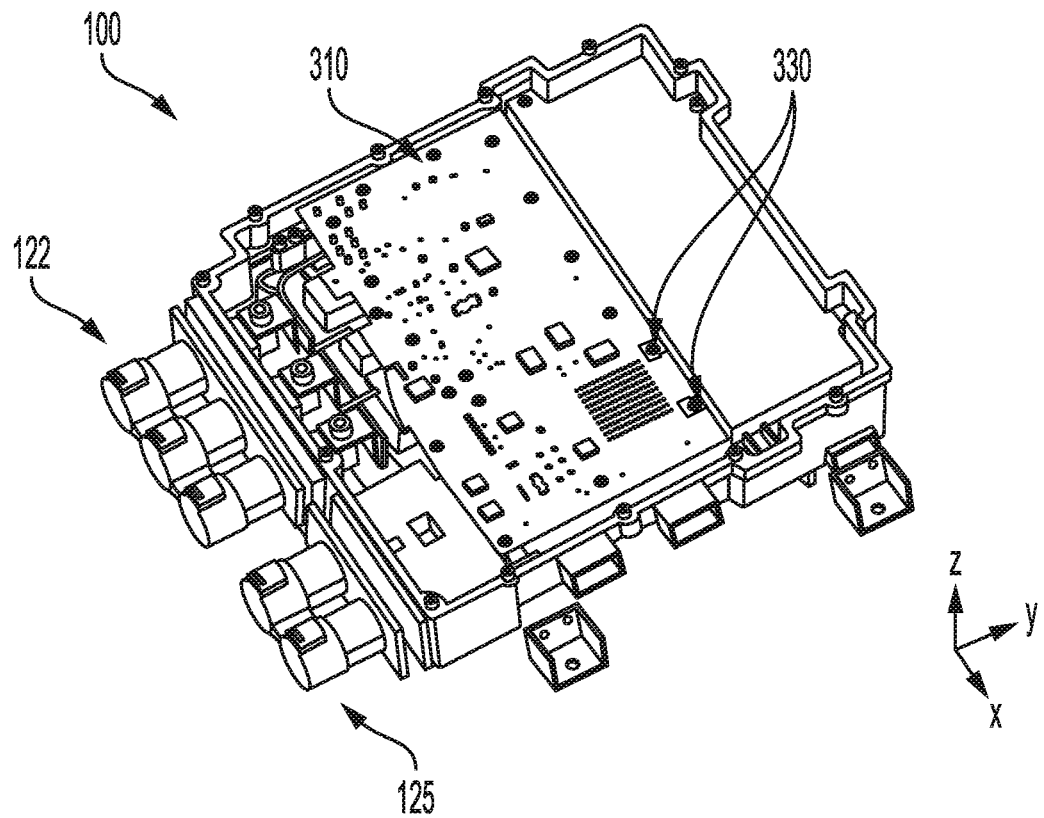
FIGS. 11-12 are different views of connectors for the control circuit board in the inverter depicted in FIG. 1.

FIGS. 9 and 10 show the external communication chamber 204 in the inverter 100 with the electrical connectors 121 electrically connected to the flexible circuit board 900 which is directly coupled to the control circuit board 310. Further, the control circuit board 310 is depicted laterally spanning the housing 132 which increases the space efficiency of the inverter. Using the flexible circuit board allows the number of cables in the inverter to be reduced thereby reducing EMI generated by the inverter and transmitted to the surrounding environment. The flexible circuit board 900 may extend from the phase-control chamber 200 to the external communication chamber 204. Further, the phase-control chamber 200, the DC chamber 202 shown in FIG. 2, and the external communication chamber 204 may be positioned in from of the DC link capacitor 106. Still further, a portion of the control circuit board 310 may extend across at least a portion of the DC chamber at a location above the chamber.

FIGS. 9-10 further show the connectors 330 that electrically couple the control circuit board 310 to the DC link capacitor 106. The connectors 330 may be connection bus bars in one example. Additionally or alternatively, the connectors 330 may be springs. When connection bus bars are used, less vibration may be transferred between the component(s) to which it is attached. The connectors 330 may specifically be directly assembled on the control circuit board which may be in contact with the bus bars of the positive and negative DC bus where it may not be electrically isolated. The connectors 330 may be located near a rear side 904 of the control circuit board 310 to facilitate a space efficient connection between the connectors and the capacitor.

The flexible circuit board 900 may function as a control to power circuit board connector in the control circuit board 310. The control to power circuit board connector allows control commands which may be received from circuits in the external communication chamber to be transferred to the control circuit board 310.

FIG. 9 additionally shows high-voltage interlock (HVIL) and internal temperature connectors 902. The HVIL is a circuit that connects the connectors in a string to detect if a connector is unplugged in order to open the battery switch to reduce the likelihood of undesired electrical discharge. Further, the power connectors may be connected in series to the connector on the control circuit board 310 and if the chain is broken, it will open the battery contactor. The internal temperature sensor measures the air temperature inside the inverter. If the temperature rises above a threshold value, the inverter may reduce the power output to avoid an uncontrolled shutdown of the controller. The operator of the vehicle may be informed by an indicator light that performance is constrained due to a high temperature condition of one of the systems. Further the discharge resistors 706, shown in FIG. 7, may be positioned under the section 905 of the control circuit board 310.

FIG. 11 again shows the inverter 100 with the control circuit board 310 that has the connectors 330 coupled thereto. The connectors 330 serve as an electrical connection between the control circuit board and the higher voltage (HV) bus. The connectors 122 and 125 for the external components are further depicted in FIG. 11. The connectors 330 extend from the DC chamber 202 upward to a location above the chamber which may be included in the phase-control chamber. To elaborate, the connectors 330 may extend in a vertical direction and includes bent sections that attach to the control circuit board and the DC bus bars 408.

Figure 12:
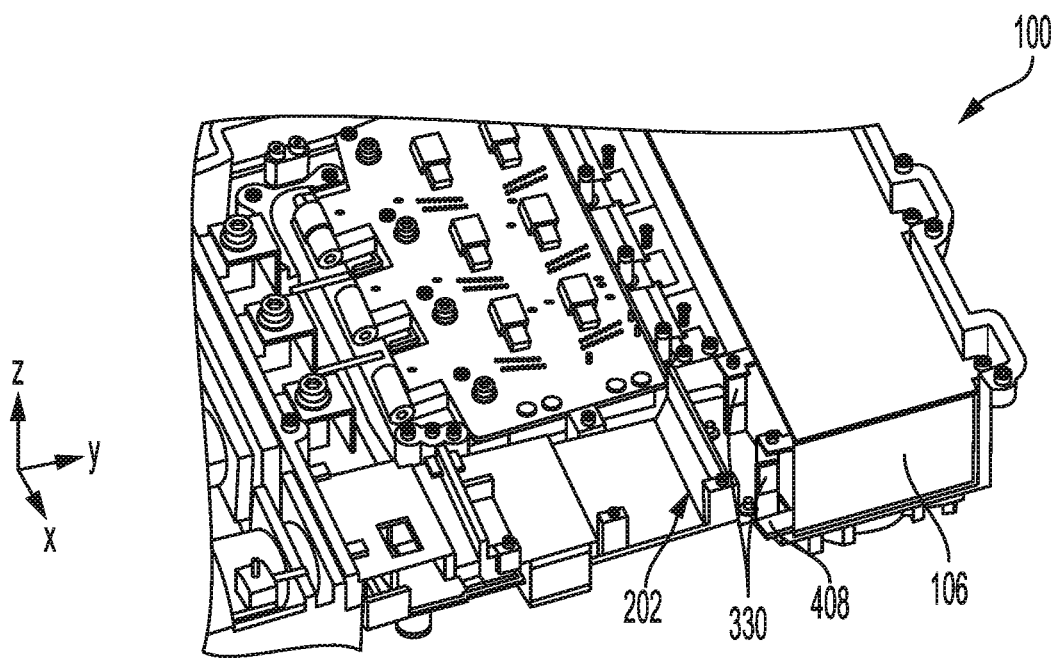

FIG. 12 shows the inverter 100 with the control circuit board removed to reveal underlying components. The connectors 330 are again illustrated along with the bus bars 408 in the DC bus bar assembly. As previously indicated the connectors 330 may take the form of springs, in other embodiments.

Figure 13:
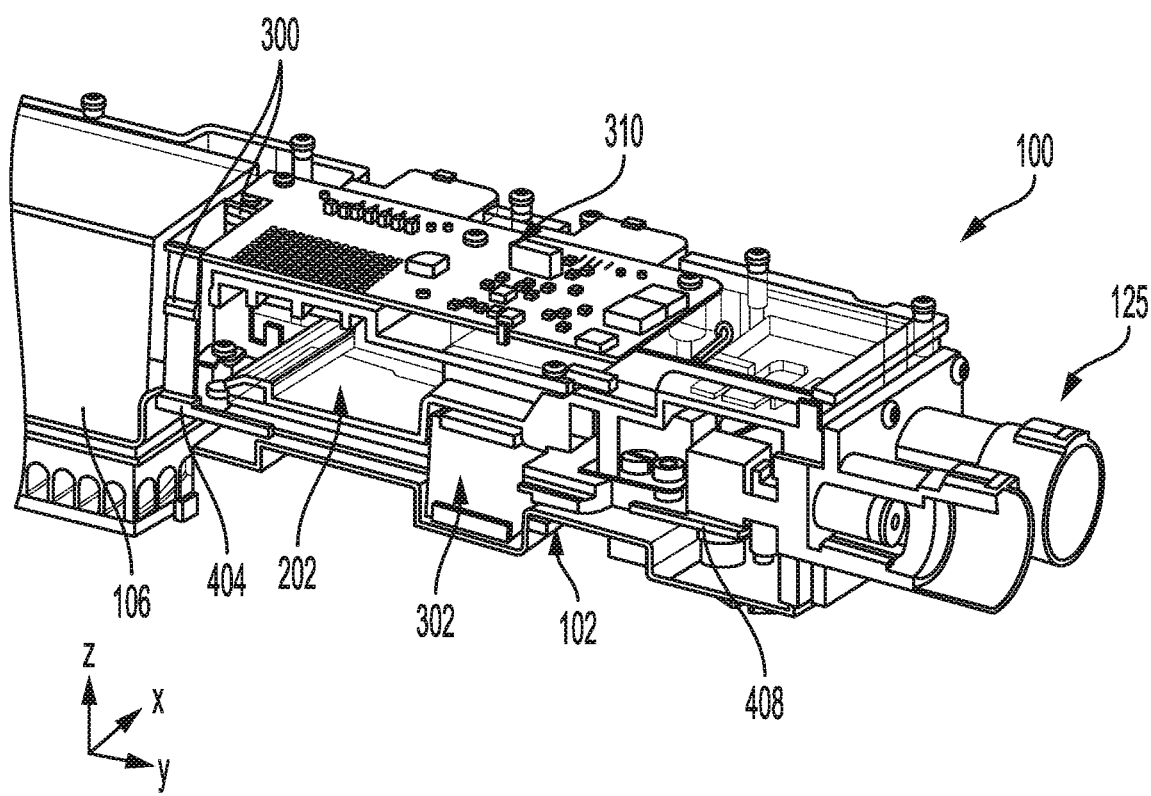
FIG. 13 is a detailed cross-sectional view of the DC bus bar assembly and the connectors, depicted in FIGS. 11-12.

FIG. 13 shows a cross-sectional view of the inverter 100 with the control circuit board 310 and the connectors 330 coupled thereto. The DC bus bar assembly 102 is further depicted in FIG. 13. The DC bus bars 404 and 408 along with the ferrite filter 302 in the DC bus bar assembly 102 are further illustrated in FIG. 13.

The connectors 330 may be positioned between (with regard to the longitudinal axis) the DC link capacitor 106 and the DC chamber 202. In this way, the connectors may be space efficiently incorporated into the inverter 100.

FIGS. 1-13 are drawn approximately to scale, aside from the schematically depicted components. Although other relative component dimensions may be used, in other embodiments.

FIGS. 1-13 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Additionally, elements co-axial with one another may be referred to as such, in one example. Further, elements shown intersecting one another may be referred to as intersecting elements or intersecting one another, in at least one example. Further still, an element shown within another element or shown outside of another element may be referred as such, in one example. In other examples, elements offset from one another may be referred to as such. Elements positioned coaxial, parallel, and/or perpendicular may be referred to as such.

The invention will be further described in the following paragraphs. In one aspect, an inverter assembly is provided that comprises a phase-control chamber including: a DC link capacitor electrically connected a control circuit board via multiple connectors; and a DC chamber including: a ferrite filter fixed to a DC bus bar via a support component; wherein a compliant pad is positioned between the ferrite filter and the support component.

In another aspect, an inverter is provided that comprises a phase-control chamber including: a DC link capacitor electrically connected a control circuit board via a connection bus bars; and a DC chamber including: a ferrite filter fixed to a DC bus bar via a support component; wherein a compliant pad is positioned between the ferrite filter and the support component; and wherein the phase-control chamber has greater electromagnetic interference than the DC chamber.

In yet another aspect, a power electronics unit for an traction motor is provided that comprises a phase-control chamber including: a direct current (DC) link capacitor electrically connected a control circuit board via a connection bus bars; and a DC chamber including: a ferrite filter fixed to a DC bus bar via a support component; wherein a compliant pad is positioned between the ferrite filter and the support component; wherein the phase-control chamber has greater electromagnetic interference (EMI) than the DC chamber; and wherein the phase-control chamber includes a discharge resistor coupled to the control circuit board and in thermal contact with a housing.

In any of the aspects or combinations of the aspects, the multiple connectors may be connection bus bars.

In any of the aspects or combinations of the aspects, the phase-control chamber may include a discharge resistor coupled to the control circuit board and in thermal contact with a housing.

In any of the aspects or combinations of the aspects, the discharge resistor may be configured to discharge the DC link capacitor when the inverter assembly is turned off.

In any of the aspects or combinations of the aspects, the compliant pad may include a polymeric foam.

In any of the aspects or combinations of the aspects, the inverter assembly may further include an external communication chamber; and the DC chamber, the external communication chamber, and the phase-control chamber may have varying levels of EMI.

In any of the aspects or combinations of the aspects, the DC chamber may be positioned laterally between the phase-control chamber and the external communication chamber.

In any of the aspects or combinations of the aspects, the DC chamber may be positioned adjacent to an external communication chamber.

In any of the aspects or combinations of the aspects, the ferrite filter may circumferentially surround a body of the DC bus bar.

In any of the aspects or combinations of the aspects, the ferrite filter may include two sections that are compressed by the support component.

In any of the aspects or combinations of the aspects, the inverter assembly may be included in an electric drive of an electric vehicle.

In any of the aspects or combinations of the aspects, the DC bus bar may be included in a DC bus bar assembly that may include a plurality of connectors designed to electrically couple to an energy storage device.

In any of the aspects or combinations of the aspects, the energy storage device may be a traction battery.

In any of the aspects or combinations of the aspects, the phase-control chamber may include a discharge resistor coupled to the control circuit board and in thermal contact with a housing and wherein the discharge resistor may be configured to discharge the DC link capacitor when the inverter assembly is turned off.

In any of the aspects or combinations of the aspects, the compliant pad may be constructed out of a polymeric foam.

In any of the aspects or combinations of the aspects, the support component may include a recess that at least partially surrounds the compliant pad and the ferrite filter.

In any of the aspects or combinations of the aspects, the support component may be constructed out of a polymer.

In any of the aspects or combinations of the aspects, the discharge resistor may be configured to discharge the DC link capacitor when the inverter assembly is turned off.

In another representation, a power converter is provided that comprises a pair of connection bus bars coupled to a control printed circuit board and a pair of high voltage bus bars that are electrically connected to a direct current (DC) link capacitor.

While various embodiments have been described above, it should be understood that they have been presented by way of example, and not limitation. It will be apparent to persons skilled in the relevant arts that the disclosed subject matter may be embodied in other specific forms without departing from the spirit of the subject matter. The embodiments described above are therefore to be considered in all respects as illustrative, not restrictive. As such, the configurations and routines disclosed herein are exemplary in nature, and that these specific examples are not to be considered in a limiting sense, because numerous variations are possible. For example, the above technology can be applied to a variety of electric systems. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range, unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. An inverter assembly, comprising:
  a phase-control chamber including:
    a direct current (DC) link capacitor electrically connected a control circuit board via multiple connectors; and
  a DC chamber including:
    a ferrite filter fixed to a DC bus bar via a support component;
  wherein a compliant pad is positioned between the ferrite filter and the support component;
  wherein the inverter assembly further includes an external communication chamber; and
  wherein the DC chamber, the external communication chamber, and the phase-control chamber have varying levels of electromagnetic interference (EMI).

2. The inverter assembly of claim 1, wherein the multiple connectors are connection bus bars.

3. The inverter assembly of claim 1, wherein the phase-control chamber includes a discharge resistor coupled to the control circuit board and in thermal contact with a housing.

4. The inverter assembly of claim 3, wherein the discharge resistor is configured to discharge the DC link capacitor when the inverter assembly is turned off.

5. The inverter assembly of claim 1, wherein the compliant pad includes a polymeric foam.

6. The inverter assembly of claim 1, wherein the DC chamber is positioned laterally between the phase-control chamber and the external communication chamber.

7. The inverter assembly of claim 1, wherein the DC chamber is positioned adjacent to the external communication chamber.

8. The inverter assembly of claim 1, wherein the ferrite filter circumferentially surrounds a body of the DC bus bar.

9. The inverter assembly of claim 8, wherein the ferrite filter includes two sections that are compressed by the support component.

10. The inverter assembly of claim 1, wherein the inverter assembly is included in an electric drive of an electric vehicle.

11. The inverter assembly of claim 1, wherein the DC bus bar is included in a DC bus bar assembly that includes a plurality of connectors designed to electrically couple to an energy storage device.

12. The inverter assembly of claim 11, wherein the energy storage device is a traction battery.

13. An inverter assembly, comprising:
a phase-control chamber including:
a direct current (DC) link capacitor electrically connected a control circuit board via multiple connectors; and
a DC chamber including:
a ferrite filter fixed to a DC bus bar via a support component;
wherein a compliant pad is positioned between the ferrite filter and the support component;
wherein the phase-control chamber has greater electromagnetic interference than the DC chamber; and
wherein the ferrite filter circumferentially surrounds a body of the DC bus bar.

14. The inverter assembly of claim 13, wherein the phase-control chamber includes a discharge resistor coupled to the control circuit board and in thermal contact with a housing and wherein the discharge resistor is configured to discharge the DC link capacitor when the inverter is turned off.

15. The inverter assembly of claim 13, wherein the compliant pad is constructed out of a polymeric foam.

16. The inverter assembly of claim 13, wherein the support component includes a recess that at least partially surrounds the compliant pad and the ferrite filter.

17. The inverter assembly of claim 13, wherein the support component is constructed out of a polymer.

18. A power electronics unit for an traction motor, comprising:
a phase-control chamber including:
a direct current (DC) link capacitor electrically connected a control circuit board via connection bus bars; and
a DC chamber including:
a ferrite filter fixed to a DC bus bar via a support component;
wherein a compliant pad is positioned between the ferrite filter and the support component;
wherein the phase-control chamber has greater electromagnetic interference (EMI) than the DC chamber;
wherein the phase-control chamber includes a discharge resistor coupled to the control circuit board and in thermal contact with a housing;
wherein the inverter assembly further includes an external communication chamber; and
wherein the DC chamber, the external communication chamber, and the phase-control chamber have varying levels of electromagnetic interference (EMI).

19. The power electronics unit of claim 18, wherein the discharge resistor is configured to discharge the DC link capacitor when the power electronics unit is turned off.

* * * * *